United States Patent [19]

Nishioka

[11] 4,054,824
[45] Oct. 18, 1977

[54] WIRE BONDING UNIT USING INFRA-RED RAY DETECTOR

[75] Inventor: Hideya Nishioka, Yokohama, Japan
[73] Assignee: Fujitsu Ltd., Kawasaki, Japan
[21] Appl. No.: 682,466
[22] Filed: May 3, 1976
[30] Foreign Application Priority Data

May 10, 1975 Japan .................................. 50-56620

[51] Int. Cl.² .................................................. G05B 1/06
[52] U.S. Cl. ................................ 318/640; 318/627; 356/172; 250/548
[58] Field of Search ............. 318/640, 627; 219/110; 250/341, 561, 548; 356/172

[56] References Cited
U.S. PATENT DOCUMENTS

| | | | |
|---|---|---|---|
| 3,731,098 | 5/1973 | Hunt | 318/640 X |
| 3,775,011 | 11/1973 | Marsh | 250/548 X |
| 3,803,474 | 4/1974 | Clarke | 318/640 |
| 3,805,073 | 4/1974 | Jayachandra et al. | 250/341 X |
| 3,955,072 | 5/1976 | Johannsmier et al. | 250/561 X |

*Primary Examiner*—Robert K. Schaefer
*Assistant Examiner*—John J. Feldhaus
*Attorney, Agent, or Firm*—Staas & Halsey

[57] ABSTRACT

A wire bonding system is disclosed wherein a patterned substrate to be bonded is composed of at least two materials having different emission rates of infra-red rays, and a point to be bonded on the patterned substrate is positioned so as to coincide with a predetermined reference position. The present invention includes a servo-mechanism, which moves the patterned substrate, and a detecting element which scans the surface of the patterned substrate in a linear direction and detects the infra-red rays radiated therefrom. A pattern figure is obtained by using the differences in the emission rate of the infra-red rays caused by the material of the pattern. A signal which indicates the pattern figure is compared with another signal which indicates the reference position, and a control signal, corresponding to the difference between the point on the pattern to be bonded and the reference position, is obtained. The servo-mechanism is controlled by said control signal so that the point to be bonded is placed at the reference position.

11 Claims, 15 Drawing Figures

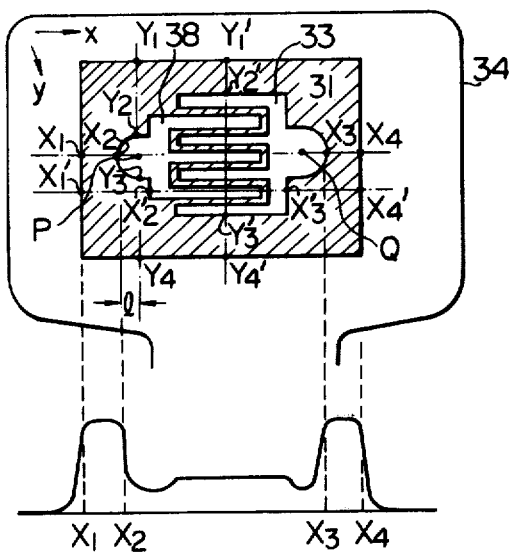
*Fig. 3A*
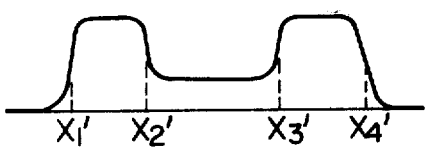
*Fig. 3B*
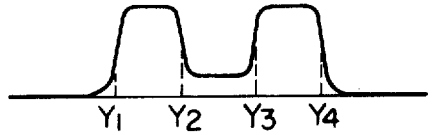
*Fig. 3C*
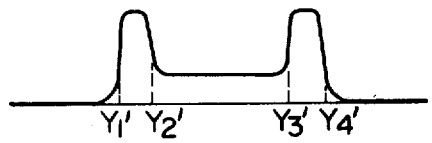
*Fig. 3D*
*Fig. 3E*
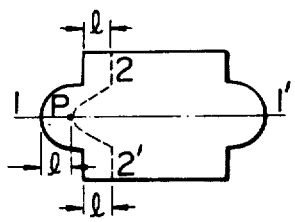
*Fig. 3F*

Fig. 5A SCW
Fig. 5B BHP
Fig. 5C PN
Fig. 5D DP
Fig. 5E DSPW
Fig. 5F DSP

WIRE BONDING UNIT USING INFRA-RED RAY DETECTOR

BACKGROUND OF THE INVENTION

1. Field of the Invention

The present invention relates to a wire bonding unit for automatically connecting electrodes of an element, such as a semi-conductor element, to fine wires.

2. Description of the Prior Art

The conventional wire bonding apparatus is usually operated manually. The operator examines the portion to be bonded with his naked eye or with a microscope, positions said portion to be bonded beneath the bonding head and brings down said bonding head on said portion so as to bond said portion to the external lead. In the conventional wire bonding apparatus, the positioning of the bonding portion is carried out with the naked eye only. Therefore, when the electrodes create a very fine pattern, a skilled workman is required for carrying out the bonding operation. Consequently, it is very difficult to complete a fine bonding operation in a very short time.

To obviate the above-mentioned drawback, the following described operation is carried out and therein a semi-automatic wire bonding apparatus is utilized. That is to say, when an element has many electrode terminals to be bonded, such as an integrating circuit element, one terminal is selected as the reference terminal and positioned manually. With respect to the other terminals, the positioning is carried out automatically by a predetermined program. This automatic operation of the semi-automatic wire bonding apparatus is based on the fact that the positions of said other terminals have a predetermined regularity with respect to the reference terminal. However, in the case where the positional relationships between the reference terminal and the other terminals are not accurate, the bonding position will not coincide with the predetermined position to be bonded. Therefore, it is necessary to continuously inspect whether or not the apparatus is operating correctly.

SUMMARY OF THE INVENTION

An object of the present invention is to provide a wire bonding unit which automatically carries out a bonding operation without relying upon the manual operation requiring the use of the naked eye.

Another object of the present invention is to provide an automatic wire bonding unit which recognizes the pattern profile of the element to be bonded by an optical pattern recognition method; quantitatively indexes the position to be bonded on said pattern; automatically positions a bonding head over the position to be bonded and bonds the position to be bonded with the fine wire. As a result of this automatic wire bonding a continuous and automatic bonding operation is carried out more rapidly and more precisely than if the previously known manual or semi-automatic operations had been utilized.

Further features and advantages of the present invention will be apparent from the ensuing description, with reference to the accompanying drawings to which, however, the scope of the invention is in no way limited.

BRIEF DESCRIPTION OF THE DRAWINGS

FIG. 3A is a diagram showing the pattern of the element to which the width bonding operation is applied;

FIGS. 3B through 3E are diagrams which show the, the detected waveform corresponding to the scanned pattern shown in FIG. 3A, FIG. 3F is a diagram showing the locus of the bonding head upon the FIG. 3A pattern when the position control is in operation;

FIGS. 5A through 5F are waveforms which appear in the several points of the circuit shown in FIG. 4.

DESCRIPTION OF THE PREFERRED EMBODIMENT

Figure 1:
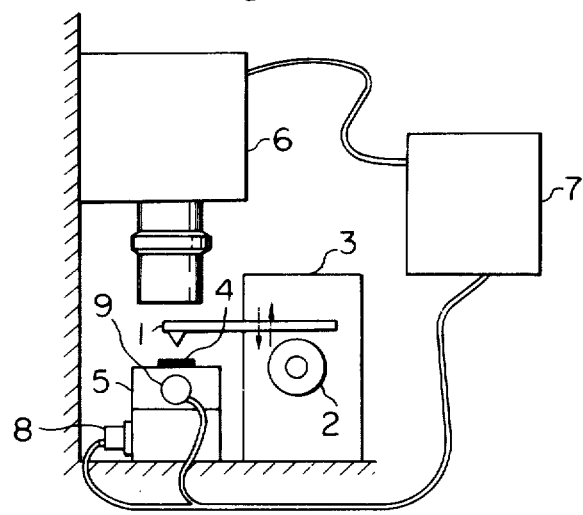
FIG. 1 is a diagram of one embodiment of the wire bonding unit according to the present invention.

As shown in FIG. 1, the apparatus according to the present invention comprises a bonding head portion 3, a working table 5, a detecting part 6 and a control portion 7. The bonding head portion 3 includes a bonding tool 1 which carries out the bonding operation utilizing fine wires, and a mechanism 2, for moving the bonding tool 1 to a desired position. The work 4, to which the bonding operation is to be applied, is mounted on the working table 5, which moves in a horizontal plane. The detecting part 6 detects the infra-red rays radiated from the work 4. The control portion 7 controls the working table 5 in response to a driving signal received from the output of the detecting part 6.

In the embodiment shown in FIG. 1, the bonding head portion 3 is in a fixed position. The working table 5 is moved so as to move the work 4 to be bonded, under the bonding tool 1. Accordingly, the working table 5 can be moved independently along two directions at right angles to each other by servo motors 8 and 9.

A conductor pattern is formed on the work for connecting the element to external leads. That is to say, in the case of a semi-conductor element, a pedetermined point of the electrode pattern formed on the chip is to be connected to a predetermined point of an external lead pattern or to a terminal by the wire bonding.

In the present invention, the above mentioned conductor pattern is detected from infra-red rays emitted from the work. According to the well-known Stefan Boltzmann's Law, all bodies emit energy which is proportional to the fourth power of the absolute temperature of the surface, and the emission rate differs greatly according to the substance of the material and the surface condition. For example, silicon and silicon dioxide used in a semi-conductor element have a large emissivity, whereas, gold, alminium, etc., used in a semi-conductor element have very small emissivity. At a relatively low temperature (lower than 400° C), at which a semi-conductor element is treated, the emitted energy exists in the infra-red region. Therefore, when the semi-conductor chip is mounted on the frame, and when the surface temperatures of the semi-conductor chip and the frame are nearly the same, the portions of the silicon or silicon dioxide of the chip emit strong infra-red rays, whereas the gold or alminium, which forms the connection pattern or the frame, emit weak infra-red rays.

Figure 2:
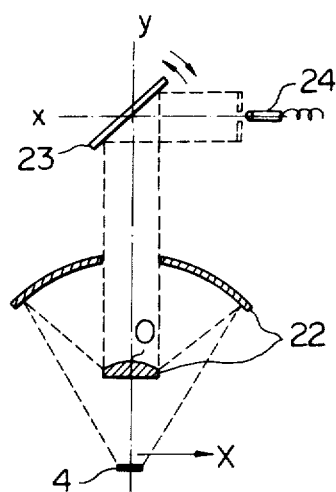
FIG. 2 is a diagram of one embodiment of the detecting part of the bonding apparatus shown in FIG. 1.

FIG. 2 is an example of the detecting part 6 of the apparatus shown in FIG. 1, which utilizes the differences in the emission rate of the infra-red rays of the materials. Referring to FIG. 2, the infra-red rays emitted from the work 4 are enlarged by an object lens 22 composed of two reflecting mirrors. The infra-red rays are next reflected by a vibrating mirror 23 so as to finally reach an infra-red ray detecting element 24.

This detecting element 24 is placed in a focus plane of the work image magnified by the object lens 22. The detecting element 24 is provided with a small window which has dimensions suitable for receiving only infrared rays passing through the minute part of the object lens 22. By vibrating the vibrating mirror 23 around the axis which is perpendicular to the light $y$ of the object lens 22 and to the light axis $x$ of the detecting element 24, the detecting element 24 optically scans the surface of the work along the X direction parallel to the light axis $x$, including the cross point 0 of the work surface and the light axis $y$. With respect to the Y direction, a scanning of the work surface, similar to that in the X direction, can be carried out.

FIG. 3A illustrates a transistor chip 31. Conductor patterns 38 and 33 are formed of alminium so that an emitter and base which are formed on the silicon substrate 31 are connected to the outside. Transistor chip 31 is fixed on a metal frame 34 which is plated with gold. Arrows $x$ and $y$ indicate the directions to be scanned. Points P and Q are the positions to which wire leads will be bonded.

If, the resolution of the infra-red ray detecting element (this is approximately equal to the ratio between the dimension of the window of the detecting element and the magnification factor of the object lens) is determined to be larger than a minimum width and minimum distance, the waveform which is scanned along the $x$ direction via points $X_1$ through $X_4$ is as shown in FIG. 3B. As shown in FIG. 3B, the highest emission of infrared rays exists in the silicon portion; the lowest emission exists in the gold portion. In the co-existing portion, of the alminium and the silicon, emission of infra-red rays occurs in the middle between the alminium portion and the silicon portion.

FIG. 3C is the waveform which is scanned along the $x$ direction via point $X_1'$ through $X_4'$, FIG. 3E is the waveform which is scanned along the $y$ direction, via points $Y_1'$ through $Y_4'$ and FIG. 3D is the waveform which is scanned along the $y$ direction, via the bonding point P. As shown in FIGS. 3B through 3E, in a semiconductor chip having a pattern as shown in FIG. 3A, the pattern to be connected exists in the low emissivity region placed between the two high emissivity regions.

Figure 4:
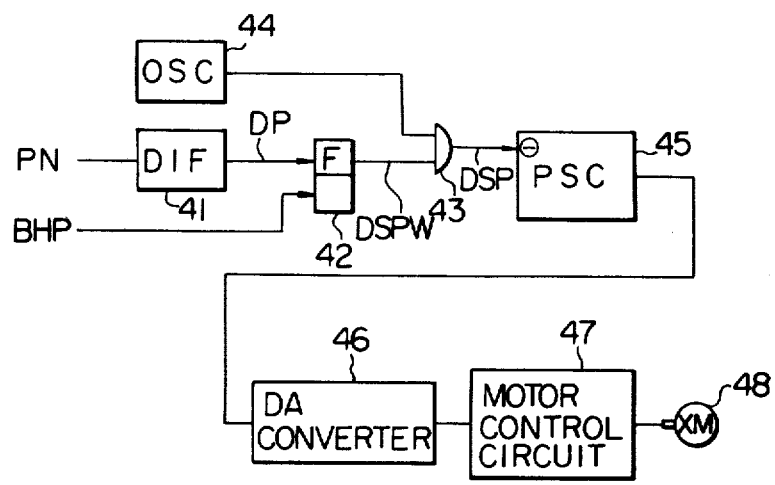
FIG. 4 is a control circuit which operates so as to move the movable table along the x-direction.

The position on the pattern where the bonding head exists, that is, the relative position relationship between the pattern and the bonding head is detected by generating a clock pulse when the scan passes under the bonding head and by comparing the timing of said pulse with the detected waveform. The signal corresponding to the relative position between the bonding head and the area to be bonded on the conductor pattern is obtained by utilizing the control circuit (as shown in FIG. 4).

In the example of the pattern shown in FIG. 3A, the point to be bonded, P, is placed, in the scanning line along the $x$ direction, at a distance $l$ from the end $X_2$ of the conductor pattern 38 and, in the scanning line along the $y$ direction, at the mid-point of the conductor pattern 38. Therefore, with respect to the scanning line along the $x$ direction, the movement in the direction $x$ of the working table 5 is controlled so that the clock pulse which indicates the position of the bonding head is generated at the position corresponding to the distance $l$ from the end of conductor pattern 38, regardless of the position in the $y$ direction of the working table 5 (in the range $Y_2 < y < Y_3$). The dotted line 2-2' in FIG. 3F shows the locus of the bonding head being controlled along the $x$ direction.

With respect to the scanning line along the $y$ direction, the movement of the working table 5, in the $y$ direction, is controlled so that the clock pulse which indicates the position of the bonding head is generated at the center of the conductor pattern region, regardless of the position of the working table in the $x$ direction (in the range $X_2 < x < X_3$). The dotted line 1-1' in FIG. 3F shows the locus of the bonding head being controlled along the $y$ direction.

When the position control is carried out at the same time with respect to $x$ and $y$ directions, the bonding head is stopped at the crosspoint of 1-1' and 2-2' which satisfies the predetermined condition with respect to $x$ and $y$ directions. There is no point that satisfies the predetermined condition other than this crosspoint.

With respect to the point Q, the control condition is determined so that, in the $x$ direction, the bonding head is positioned at the distance $l$ from the right end of the conductor pattern region 33 and, in the $y$ direction, the bonding head is positioned at the center of the conductor pattern 33, similar to the condition concerning the point P.

FIG. 4 is the control circuit for positioning the working table 5 along the $x$ direction. FIGS. 5A through 5F are waveforms which appear in several parts of the control circuit shown in FIG. 4.

As mentioned above, with respect to the positioning along the $x$ direction, the bonding point P exists at the constant distance $l$ from the end $X_2$ of the conductor pattern 38. Therefore, if the distance between the position of the bonding head and the end of the conductor pattern 38 is obtained, positioning of the working table in the $x$ direction is performed so that the difference between these distances becomes zero.

Referring to FIGS. 4 and 5, a signal PN is the output of the infra-red ray detecting element; a signal SCW is the scanning width, that is, the range which can be observed with the vibrating mirror 23; and a signal BHP is the reference head position pulse which indicates the reference position of the bonding head. When the pattern signal PN is supplied from the infra-red ray detecting element to the control circuit, said signal PN is differentiated by the differentiation circuit 41. A negative output DP of the differentiation circuit 41 sets the flip-flop 42 with a positive signal DSPW so that an AND gate 43 is opened. In this condition, a high freguency pulse DSP generated in an oscillator 44 is gated to a subtraction terminal of a preset counter 45 which is set at the predetermined value corresponding to the distance $l$. One count is subtracted from the contents of the preset counter 45 every time a DSP pulse is gated from the oscillator 44. As the position of the bonding head is fixed with respect to the detecting part 6, the pulse BHP which indicates the position of the bonding head appears at the predetermined time $ta$ after the scanning is begun. This pulse signal resets the flip-flop 42 so that the gate is placed in the off-condition and the supply of the high frequency pulse from the oscillator 44 is inhibited. Therefore, the counted value which corresponds to the difference between the position of the bonding head and the position to be bonded is stored in the preset counter 45. This stored value is supplied to a digital analog converter 46 where the output of the preset counter 45 is converted to an analog voltage. The analog voltage is supplied to a motor control circuit 47, and the motor 48 is thereby controlled so that the working table 5 is moved along x axis direction. This control operation is continued until the point to be bonded is placed precisely under the bonding head. A similar control is effected with respect to the movement of the working table in the Y direction.

The above explanation concerns automatic wire bonding for a transistor chip; however, this idea is also applicable to external terminals of the lead frame or stem of the chip. This concept is additionally applicable to wire bonding for integrated circuit, hybrid circuits, or print circuit.

Further, the above explanation is directed to the case where the infra-red rays detecting element and the bonding head are fixed, and the work is movable by the working table. However, the present invention also includes all cases where the work and the bonding head have relative movement.

Still further, in the above explanation a mechanical scanning system is aplied so as to recognize the conductor pattern region. However, an electronic scanning system which utilizes an image pick-up tube having a high sensitivity in the infra-red ray region can be used.

As mentioned above, the characteristic functions of the present invention are to recognize the conductor pattern, to research the point to be bonded in the conductor pattern according to a predetermined condition, to place the bonding head automatically upon the point to be bonded and to bond the point to be bonded with a fine wire. Therefore, when compared to the conventional wire bonding systems wherein the skilled workman's vision is utilized, or wherein the point to be bonded is based on a special reference point, the present invention can certainly ensure a more precise automatic wire bonding.

What is claimed is:

1. Wire bonding unit for positioning a work having a pattern thereon composed of at least two materials having different emission rates of infra-red rays so that a position to be bonded with a wire on said pattern coincides with a predetermined reference position, said wire bonding unit comprising:
    a servo-mechanism means for relatively moving said work with respect to said reference position;
    an infra-red ray detecting means for detecting the infra-red rays radiated from said pattern by scanning the surface of said work in a first direction;
    a pattern signal generating means for generating a signal corresponding to a portion of said scanned pattern obtained in accordance with the difference in the emission rates of infra-red rays from said materials, and;
    means for generating a reference signal indicating when said detecting scans across said predetermined reference position;
    a controlling means for comparing said pattern signal with said reference signal and producing a control signal corresponding to the distance between said position to be bonded and said predetermined reference position, and for controlling said servo-mechanism by said control signal so that said position to be bonded coincides with said predetermined reference position.

2. Wire bonding unit according to claim 1, wherein said controlling means comprises:
    a differentiation circuit for differentiating said pattern signal which corresponds to said pattern figure;
    a flip-flop circuit which is set by the output of said differentiation circuit and is reset by said reference signal which indicates said predetermined position;
    an oscillator which generates high frequency pulses;
    an AND gate which passes said high frequency generated by said oscillator when said flip-flop circuit is set;
    a preset counter being preset with a predetermined number of pulses corresponding to said predetermined reference position whose content decreases by one pulse as every said output pulse is supplied and which generates the number of pulses corresponding to the difference between said position to be bonded and said predetermined reference position, and;
    a digital analog converter which converts the output of said preset counter to an analog signal for controlling said servo-mechanism.

3. A wire bonding system for bonding a wire to a predetermined point on a work piece, comprising:
    means for holding said work piece;
    means for bonding said wire to said held work piece;
    means for scanning said held work piece and producing an output signal;
    means responsive to said scanning means output signal for positioning said held work piece with respect to said bonding means, wherein said responsive means stops said positioning when said predetermined point on said work piece is positioned to be bonded with said wire by said bonding means.

4. A wire bonding system as in claims 3, wherein said scanning means detects infra-red rays emitted from discrete portions of said held work piece and produces an electrical signal which varies according to said detected infra-red rays.

5. A wire bonding system as in claim 4, wherein said scanning means includes means for optically focusing an image of said held work piece onto an image plane, and means located intermediate said focusing means in said image plane for shifting said image across said image plane.

6. A wire bonding system as in claim 5, wherein said scanning means includes an infra-red detector in said image plane.

7. A wire bonding system as in claim 5, wherein said focusing means includes a plurality of reflector elements.

8. A wire bonding system as in claim 5, wherein said shifting means comprises a vibrating mirror.

9. A wire bonding system as in claim 3, wherein said positioning means includes means for measuring the relative distance between said predetermined point and said bonding means, and means for driving said holding means according to said measured distance.

10. A wire bonding system as in claim 9, wherein said measuring means includes an oscillator for producing a continuous timing signal, means for receiving said scanning means output signal and gating said timing signal as a function of said measured relative distance.

11. A wire bonding system as in claim 3, wherein said scanning means includes means for scanning said work piece in orthogonal directions.

* * * * *